US006291362B1

(12) United States Patent
Lee

(10) Patent No.: US 6,291,362 B1
(45) Date of Patent: Sep. 18, 2001

(54) METHOD OF FABRICATING DIELECTRIC LAYER AND FLUORESCENT FILM FOR PLASMA DISPLAY DEVICE

(75) Inventor: Yoon Kwan Lee, Kyunggi-do (KR)

(73) Assignee: LG Electronics Inc., Seoul (KR)

(*) Notice: Subject to any disclaimer, the term of this patent is extended or adjusted under 35 U.S.C. 154(b) by 0 days.

(21) Appl. No.: 09/298,837

(22) Filed: Apr. 26, 1999

(30) Foreign Application Priority Data

Apr. 27, 1998 (KR) .......................................... P98-15022

(51) Int. Cl.[7] .......................... H01L 21/31; H01L 21/469

(52) U.S. Cl. ............................ 438/758; 438/763; 501/20

(58) Field of Search .................................. 438/758, 395, 438/763, 782; 501/20, 22, 26; 427/38, 64, 242; 445/24

(56) References Cited

U.S. PATENT DOCUMENTS 4,397,885 * 8/1983 Akai et al. ............................ 427/38
4,695,403 * 9/1987 Nishimura et al. .................. 252/513
4,951,604 * 8/1990 Temple et al. ....................... 118/723
5,836,798 * 11/1998 Dannoux et al. ...................... 445/24
6,010,973 * 1/2000 Watanabe et al. ..................... 501/20

FOREIGN PATENT DOCUMENTS 10-67534 3/1998 (JP) .
P92-5281 3/1992 (KR) .

* cited by examiner

*Primary Examiner*—David Nelms
*Assistant Examiner*—Phuc T. Dang
(74) *Attorney, Agent, or Firm*—Fleshner & Kim, LLP

(57) ABSTRACT

A method of fabricating a dielectric layer for a plasma display device that is suitable for forming the dielectric layer through a simple process and improving a characteristic of the dielectric layer. In order to fabricate the dielectric layer, non-crystallized glass powder is prepared. The non-crystallized powder is deposited on a substrate after it is mixed with oxide powder.

24 Claims, 6 Drawing Sheets

METHOD OF FABRICATING DIELECTRIC LAYER AND FLUORESCENT FILM FOR PLASMA DISPLAY DEVICE

BACKGROUND OF THE INVENTION

1. Field of the Invention

This invention relates to a plasma display device, and more particularly to a method of fabricating a dielectric layer for a plasma display device wherein the dielectric layer is formed by depositing dielectric powder on a substrate directly. Also, this invention is directed to a method of fabricating a fluorescent film wherein the fluorescent film is formed by depositing fluorescent powder on a substrate directly.

2. Description of the Related Art

A conventional alternative current system plasma display panel (hereinafter, AC-system PDP) includes a lower glass substrate 10 mounted with an address electrode 12, and an upper glass substrate 20 mounted with a transparent electrode pair 22, as shown in FIG. 1. A lower dielectric thick film 14 with a predetermined thickness for forming a wall charge and a barrier rib 16 for dividing discharge cells are sequentially formed on the lower glass substrate 10 mounted with the address electrode 12. A fluorescent film 18 is coated on the surface of the lower dielectric thick film 14 and the wall surface of the barrier rib 16 into a predetermined thickness. The fluorescent film 18 is radiated by an ultraviolet generated during the plasma discharge to generate a visible light. Meanwhile, an upper dielectric thick film 24 and a protective film 26 are sequentially formed on the bottom surface of the upper glass substrate 20 mounted with the transparent electrode pair 22. The upper dielectric thick film 24 forms a wall charge like the lower dielectric thick film 14, and the protective film 26 protects the upper dielectric thick film 24 from an impact of gas ions during the plasma discharge. Such an AC-system PDP has discharge cells formed by isolating the lower and upper glass substrates 10 and 20 through the barrier rib 16. He+Xe mixture gas or Ne+Xe mixture gas is sealed into the discharge cells.

All the lower and upper dielectric thick films 14 and 24 used in such an AC-system PDP must have a capability of performing a function of anti-diffusion film as well as improving the discharge sustenance and the radiation efficiency. In order to perform a function of anti-diffusion film, all the lower and upper dielectric thick films 14 and 24 must have a high thermal stability, a high calcining temperature and a dense organization. Also, in order to improve the radiation efficiency, that is, in order to improve the brightness, the lower glass substrate 14 must have a high reflective coefficient in such a manner to reflect a visible light back-scattered from the fluorescent film 18 while the upper glass substrate 24 must a high transmissivity in such a manner to transmit visible lights from the fluorescent film 18 as much as possible. Furthermore, in order to improve the discharge sustenance, the lower dielectric thick film 14 must have a low dielectric constant while the upper dielectric thick film 24 must have a high dielectric constant. For instance, it is required that the upper dielectric thick film 24 have a dielectric constant more than "13" and the lower dielectric thick film 14 have a dielectric constant less than "10".

The dielectric thick films 14 and 24 are formed by a process as shown in FIG. 2. In step 30, non-crystallized glass powder is prepared. In order to prepare the non-crystallized glass powder, raw materials of a $SiO_2$—ZnO—$B_2O_3$ group non-crystallized glass or a $P_2O_5$—ZnO—BaO group non-crystallized glass are mixed at a desired component ratio. The raw materials of the mixed $SiO_2$—ZnO—$B_2O_3$ group non-crystallized glass or a $P_2O_5$—ZnO—BaO group non-crystallized glass are heated for about 5 hours into a temperature of about 1100° C. at a melting furnace to be melted. In the period of melting the raw materials of the non-crystallized glass, the raw materials is stirred two or three times to produce a uniform liquid-state non-crystallized glass. The liquid-state non-crystallized glass is suddenly cooled to thereby have a dense organization and to produce glass cullets with minute cracks. The cullets are milled for a desired time (e.g., 16 hours) by the ball milling technique and thereafter passes through #170 and #270 sievers sequentially, thereby making non-crystallized powder having a particle size of about 6 $\mu$m. In step 32, such non-crystallized glass powder is mixed with filler powder at a predetermined component ratio. The non-crystallized glass powder and the filler powder having the predetermined component ratio is mixed during a desired time (e.g., 10 hours) by means of a tumbling mixer. In step 34, the non-crystallized glass powder and the filler powder mixed in this manner is mixed with an organic vehicle at a predetermined component ratio to thereby produce a paste. Herein, a mixture of butyl-carbitol-acetate(ICA), butyl-carbitol(BC) and ethyl-cellulose(EC) with the organic vehicle at a desired ratio is used as the organic vehicle. A viscosity of the paste is varied in accordance with a quantity of EC to have an influence on the rheology and sintering characteristic. Subsequently, in step 36, the paste is coated on the glass substrate 10 or 20 at a uniform thickness. The coating of the paste is carried out by a repetitive screen printing. In the screen printing technique, as shown in FIG. 3A, a screen 40 is installed at the upper portion of the glass substrate 10 or 20, and a paste 42 is disposed on one edge of the screen 40. The paste 42 is pushed into other edge of the screen 40 in such a manner to be coated on the glass substrate 10 or 20 at a constant thickness as shown in FIG. 3B. Then, the paste 42 is again put on one edge of the screen 40 as shown in FIG. 3C. The paste 42 is further pushed into other edge of the screen 40 by a squeezer such that it is again coated on the glass substrate 10 or 20 as shown in FIG. 3D. By such a repetitive screen printing, the paste 42 is coated on the glass substrate 10 or 20 at a desired thickness (e.g., 15 to 20 $\mu$m). The glass substrate 10 or 20 coated with the paste 42 in this manner is dried during a desired time (e.g., about 20 to 30 minutes) at a temperature of 350 to 400° C. within a dry oven (not shown) at the atmosphere. At this time, an organic vehicle included in the paste is completely burned out. After the organic vehicle is completely eliminated, the glass substrate 10 or 20 is heated into the crystallization temperature during a desired time to sinter a non-crystallized glass included in the paste 42. Consequently, the glass substrate 10 or 20 is cooled during a desired time(e.g., about 40 minutes) at a cooling time of 6° C./min to form a dielectric thick film 14 or 24 on the glass substrate 10 or 20. Herein, the paste 42, that is, a sintering temperature of the dielectric thick film 14 or 24 is set to less than 600° C. so as to minimize a thermal deformation of the glass substrate, 10 or 20.

Such a screen printing technique complicates a dielectric thick film fabricating method because it needs a forming process and a sintering process of the paste. The calcining temperature is too low at the time of sintering the paste, the dielectric thick film is not eliminated completely to have a non-uniform surface. Due to this, the dielectric thick film absorbs or scatters a visible light to have a low light transmissivity. On the contrary, when the calcining temperature is too high, the surface of the dielectric thick film is damaged. As a result, a bonding between the dielectric thick film and the protective film is not only weakened, but also a characteristic of the protective film is deteriorated. The fluorescent film included in the PDP along with the dielectric thick film also is formed by the paste producing process, the screen printing process and the sintering process in similarity to the dielectric thick film. Due to this, the fluorescent film fabricating method also is complicated like the dielectric thick film fabricating method. Furthermore, the fluorescent thick film also has a non-uniform surface because an air gap is not eliminated completely.

SUMMARY OF THE INVENTION

Accordingly, it is an object of the present invention to provide a method of fabricating a dielectric layer for a plasma display device that is suitable for forming the dielectric layer through a simple process as well as improving a characteristic of the dielectric layer.

Further object of the present invention is to provide a method of fabricating a fluorescent film for a plasma display device that is adaptive for forming the fluorescent film through a simple process.

In order to achieve these and other objects of the invention, a method of fabricating a dielectric layer for a plasma display device according to one aspect of the present invention includes the steps of preparing non-crystallized glass powder; mixing the non-crystallized glass powder with oxide powder; and depositing the mixture power of the non-crystallized glass powder and the oxide powder.

A method of fabricating a fluorescent film for a plasma display device according to another aspect of the present invention includes the steps of preparing fluorescent powder; and depositing the fluorescent powder on a substrate.

BRIEF DESCRIPTION OF THE DRAWINGS

These and other objects of the invention will be apparent from the following detailed description of the embodiments of the present invention with reference to the accompanying drawings, in which.

DETAILED DESCRIPTION OF THE PREFERRED EMBODIMENT

Figure 1:
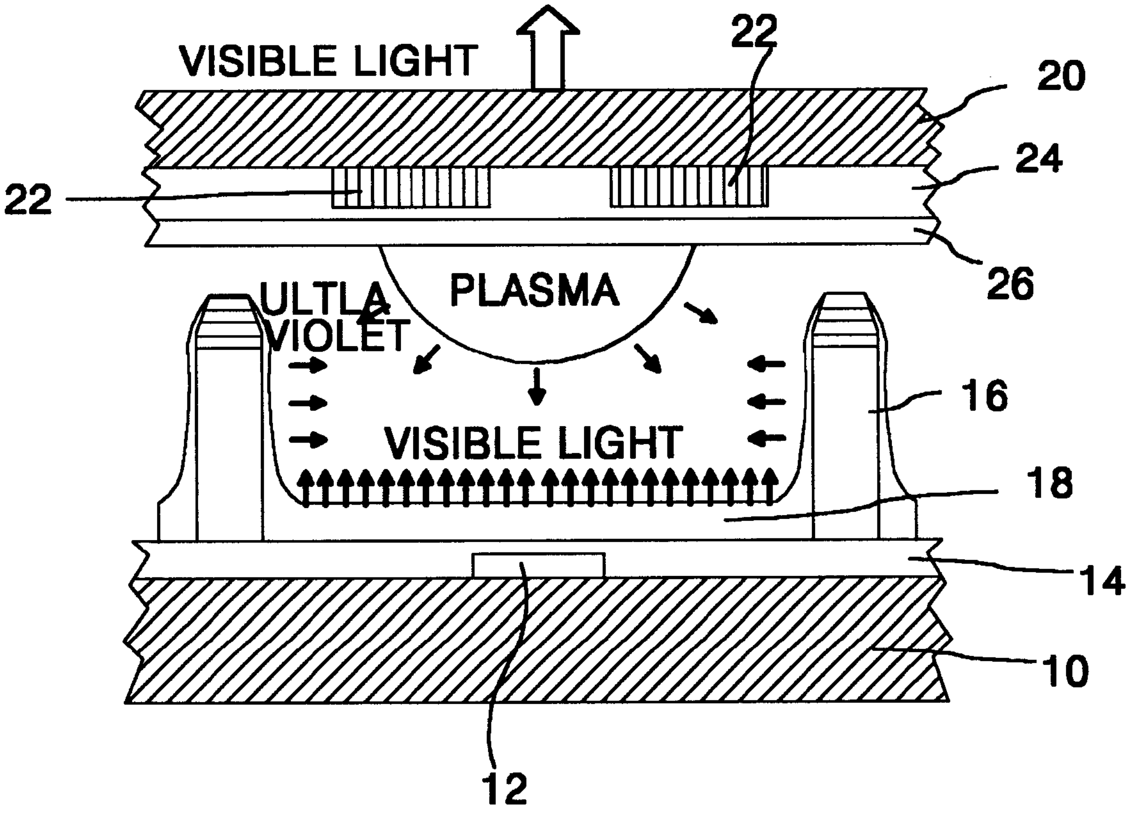
FIG. 1 RELATED ART
FIG. 1 is a schematic view showing the structure of a conventional plasma display device.
Figure 2:
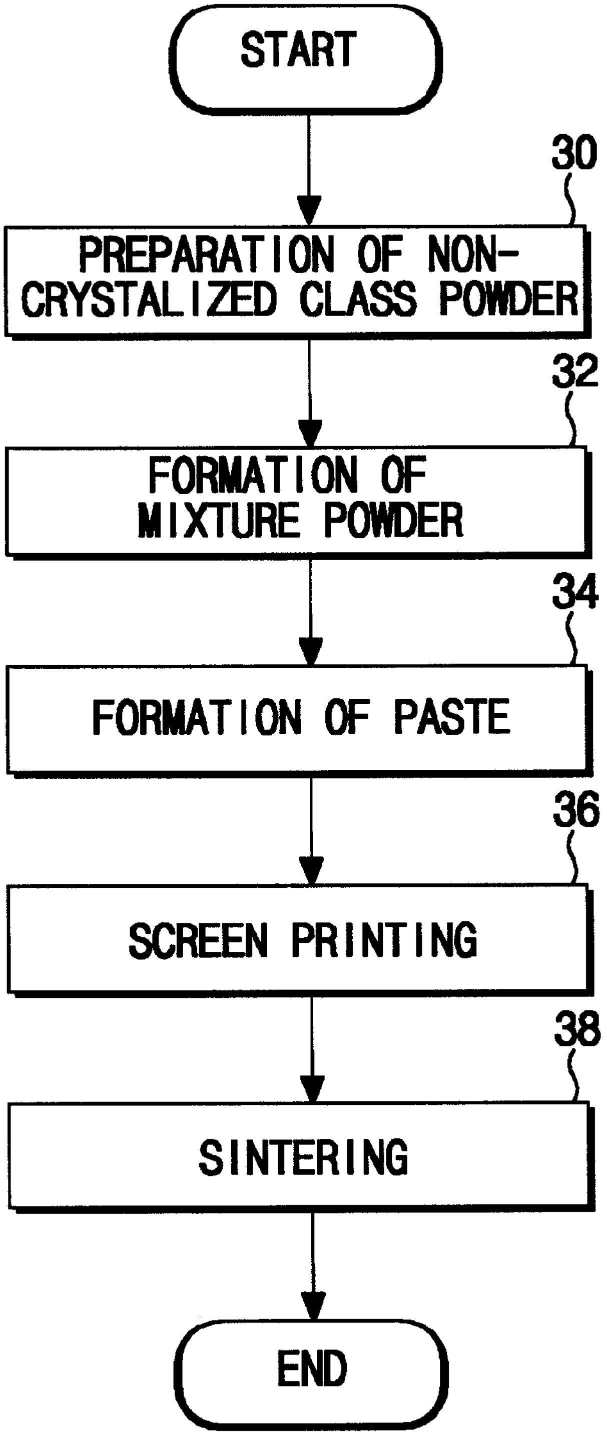
FIG. 2 is a flow chart for explaining a conventional dieletric thick film fabricating method.
Figure 3A:
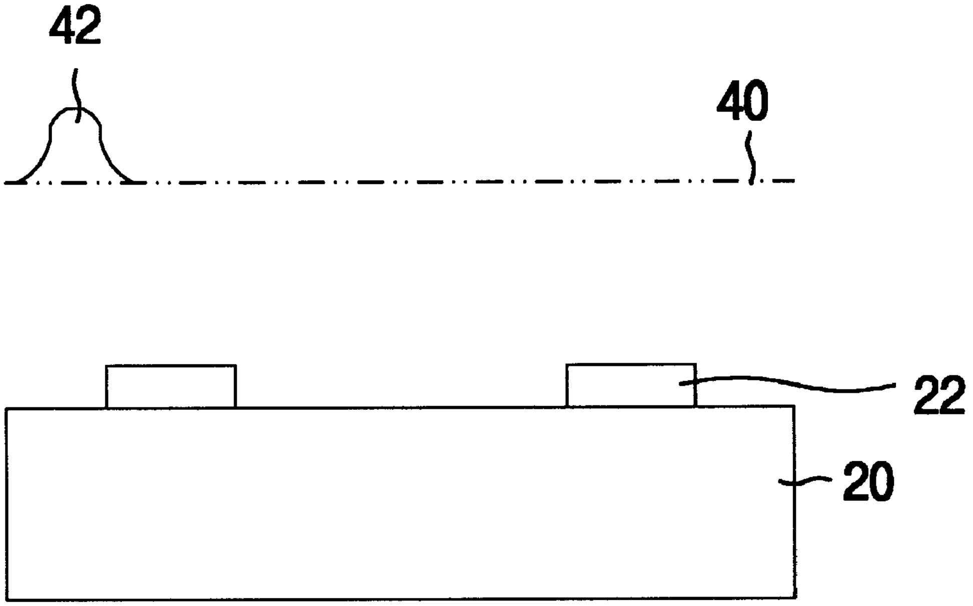
FIG.3A RELATED ART
FIGS. 3A to 3D are sectional view of a glass substrate for explaining a procedure in which a paste is printed on the glass substrate by the conventional screen printing process.
Figure 3B:
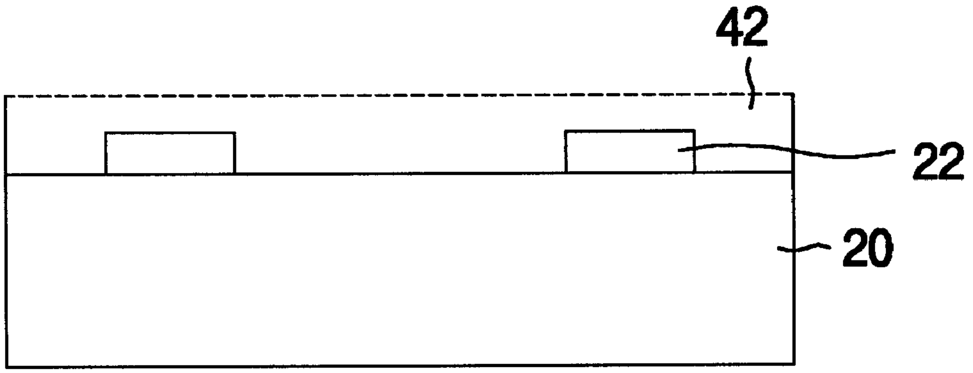
FIG.3B RELATED ART
Figure 3C:
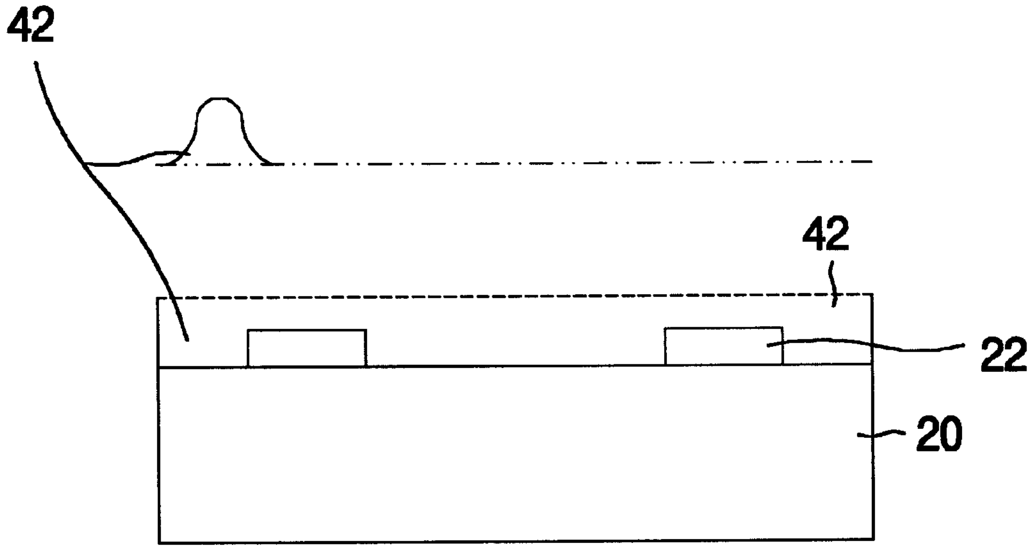
FIG.3C RELATED ART
Figure 3D:
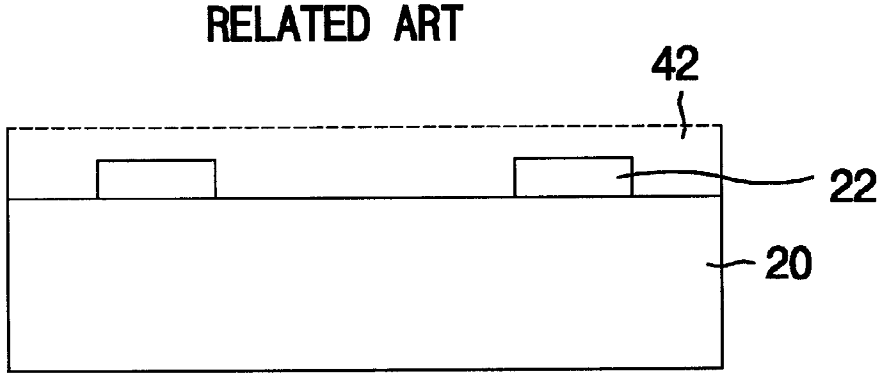
FIG.3D RELATED ART
Figure 4:
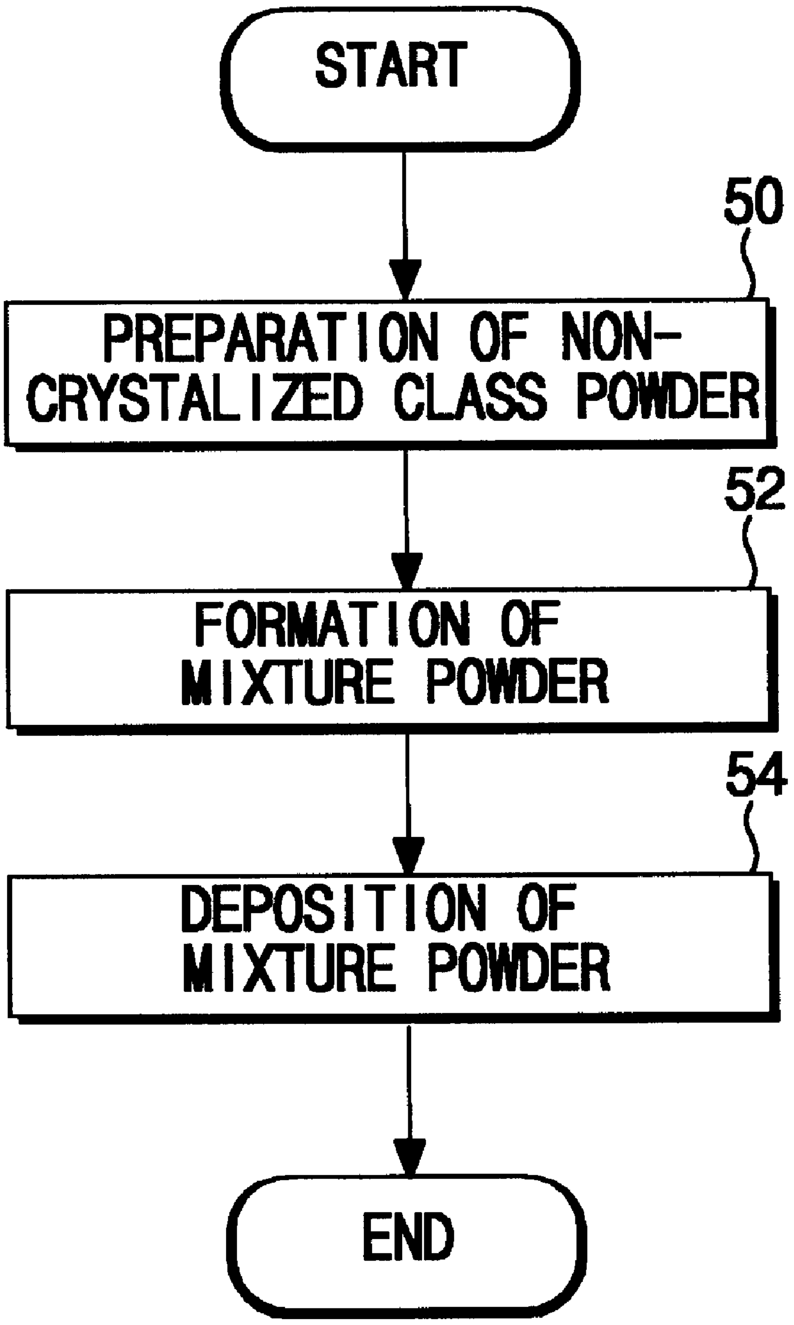
FIG. 4 is a flow chart for explaining a method of fabricating a dielectric thick film for a plasma display device according to an embodiment of the present invention.

Referring to FIG. 4 for explaining a method of fabricating a dielectric thick film according to an embodiment of the present invention, in step 50, non-crystallized glass powder is prepared. In order to prepare the non-crystallized glass powder, raw materials of a $SiO_2$—ZnO—$B_2O_3$ group non-crystallized glass or a $P_2O_5$—ZnO—BaO group non-crystallized glass are mixed at a desired component ratio. The raw materials of the mixed $SiO_2$—ZnO—$B_2O_3$ group non-crystallized glass or a $P_2O_5$—ZnO—BaO group non-crystallized glass are heated for about 5 hours into a temperature of about 1000° C. to 1100° C. at a melting furnace to be melted. In the period of melting the raw materials of the non-crystallized glass, the raw materials is stirred two or three times to produce a uniform liquid-state non-crystallized glass. The liquid-state non-crystallized glass is suddenly cooled to thereby have a dense organization and produce glass cullets with minute cracks. The cullets are milled for a desired time (e.g., 16 hours) by the ball milling technique and thereafter passes through #170 and #270 sievers sequentially, thereby making non-crystallized powder having a particle size of about 5 $\mu$m. In step 52, such non-crystallized glass powder is mixed with several weight % of filler powder at a predetermined component ratio. The non-crystallized glass powder and the filler powder are mixed during a desired time (e.g., 10 hours) by means of a tumbling mixer. Oxide powder expediting a crystallization of the non-crystallized glass is used as the filler powder. The oxide powder consist of articles having a size of about 3 $\mu$m. Mixture powder of the non-crystallized glass powder and the oxide powder is kept at a constant temperature within a dry oven.

Figure 5:
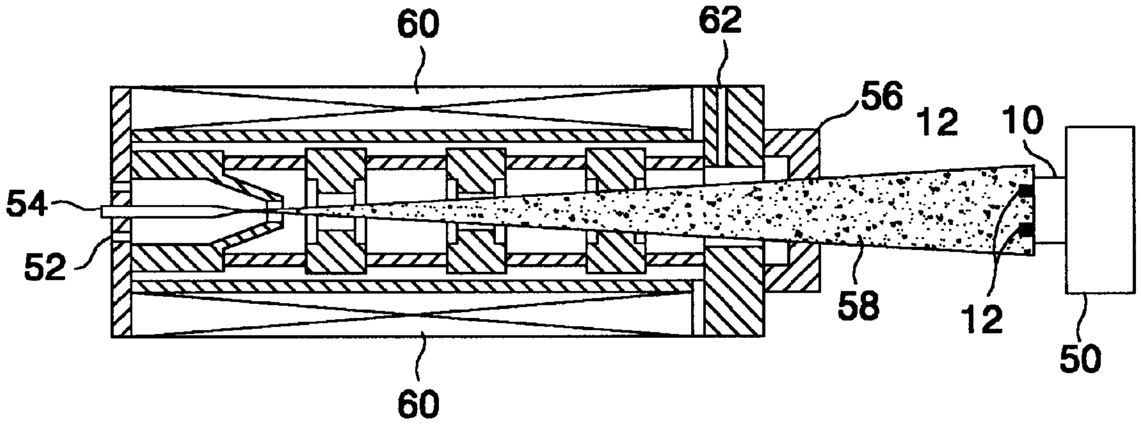
FIG. 5 is a schematic sectional view showing the structure of a direct current plasma jet deposition device.

In step 54, the mixture powder of the non-crystallized glass powder and the filler powder is vapor-deposited on the glass substrate 10 or 20 in which an electrode 12 or 22 is formed by a direct current arc plasma jet deposition (DC-APJD) device as shown in FIG. 5. In order to deposit the mixture powder on the glass substrate 10 or 20, the glass substrate 10 or 20 in which the electrode 12 or 22 is formed, is mounted into a substrate holder 50 cooled by a water. When an argon gas is supplied at a flux of 8 to 10 l/min through a gas injection hole 52 and, at the same time, a desired electric power (e.g. 30 to 50 kW) is applied between a cathode 54 and an anode 56, a jet plasma 58 with a high temperature (e.g., 6000° C. to 10000° C.) generated by ionizing and suddenly expanding the argon gas is ejected into the glass substrate 10 or 20 at the speed of sound. The jet plasma 58 is subject to have a high density and a stabilization when it passes a magnetic field formed by a magnetic coil 60 Under this state, if the mixture powder of the non-crystallized glass powder and the oxide powder is supplied through a powder injection hole 62, then non-crystallized glass articles of about 5 $\mu$m and oxide articles of about 3 $\mu$m have their surface melted instantaneously by the jet plasma with a temperature of 6000° C. to 10000° C. and are ejected into the glass substrate 10 or 20 at the speed of sound to thereby be attached onto the glass substrate 10 or 20. At this time, because the jet plasma is subject to a high density and a uniformity by the magnetic field, the mixture powder ejected along with the jet plasma also are distributed densely and uniformly. Accordingly, a dielectric thick film having minute particles of 0.1 to 1 $\mu$m distributed densely and uniformly is obtained on the glass substrate 10 or 20, Also, the dielectric thick film 14 or 24 has a low air perforation rate. As a result, the dielectric thick film 14 or 24 has a reduced dielectric loss. Further, the dielectric thick film 14 or 24 is strongly bonded to the protective film and permits a characteristic of the protective film to be improved. Moreover, the dielectric thick film 14 or 24 formed in the above-mentioned manner may undergo a thermal treatment so as to have a more dense and uniform particle structure. Meanwhile, the DC-APJD device shown in FIG. 5 is installed within a vacuum chamber (not shown) in which an atmosphere within itself is exhausted into about $10^{-6}$ Torr by a vacuum pump to have a vacuum state. The method of vapor-depositing the powder onto the substrate using the DC-APJD device is referred to as “direct arc plasma deposition method”.

Hereinafter, a method of fabricating a fluorescent film according to an embodiment of the present invention will be explained. In order to form red(R), green(G) and blue(B) fluorescent films on the glass substrate provided with a dielectric thick film and a barrier rib, R, G and B fluorescent powder is prepared. Each of the R, G and B fluorescent powder consists of oxide particles. The R fluorescent powder is deposited on the wall surfaces of the dielectric thick film and the barrier rib by means of the DC-APJD as shown in FIG. 5. Subsequently, the G fluorescent powder and the B fluorescent powder are sequentially deposited on the wall surfaces of the dielectric thick film and the barrier rib into a constant thickness by means of the DC-APJD device. The R, G and B fluorescent films are deposited on the glass substrate provided with the dielectric thick film and the barrier rib into a constant thickness by the direct current plasma deposition method, so that the fluorescent films can have a organization structure in which fluorescent particles thereof are densely and uniformly distributed.

As described above, in the dielectric thick film fabricating method according to the present invention, the mixture powder of the non-crystallized glass powder and the filler powder is deposited directly on the glass substrate. Accordingly, the dielectric thick film fabricating method according to the present invention is capable of eliminating the paste producing process, the screen printing process and the sintering process. Also, the dielectric thick film fabricating method can prevent a characteristic of the dielectric thick film from being deteriorated due to a sintering temperature during the sintering process. Moreover, the dielectric thick film fabricating method may be applied to an easy fabrication of the barrier rib without using the screen printing method. In this case, a productivity of the plasma display device is improved.

In addition, in the fluorescent film fabricating method according to the present invention, the mixture powder of the non-crystallized glass powder and the filler powder is deposited directly on the glass substrate. Accordingly, the dielectric thick film fabricating method according to the present invention is capable of eliminating the paste producing process, the screen printing process and the sintering process. Also, the dielectric thick film fabricating method can prevent a characteristic of the dielectric thick film from being deteriorated due to a sintering temperature during the sintering process.

Although the present invention has been explained by the embodiments shown in the drawings described above, it should be understood to the ordinary skilled person in the art that the invention is not limited to the embodiments, but rather that various changes or modifications thereof are possible without departing from the spirit of the invention. Accordingly, the scope of the invention shall be determined only by the appended claims and their equivalents.

What is claimed is:

1. A method of fabricating a dielectric layer for a plasma display, comprising:

preparing glass powder;

mixing the glass powder with oxide powder; and pressure vapor-depositing the mixture of the glass powder and the oxide powder.

2. The method as claimed in claim 1, wherein the mixing step includes mixing the glass powder with the oxide powder during a desired time and thereafter storing the mixture powder at a constant temperature within a dry oven.

3. The method as claimed in claim 1, wherein the vapor-depositing step includes melting the mixture powder instantaneously using a high temperature of jet plasma and vapor-depositing the same on a glass substrate.

4. The method as claimed in claim 3, wherein the vapor-depositing step makes use of a direct current arc plasma jet deposition device.

5. The method as claimed in claim 1, wherein the mixture powder is deposited on a lower glass substrate of the plasma display device, thereby forming at least one of a dielectric thick film and a barrier rib.

6. A method of fabricating a fluorescent film for a plasma display device, comprising:

preparing fluorescent powder; and vapor-depositing the fluorescent powder on a substrate.

7. The method as claimed in claim 6, wherein the vapor-depositing step includes melting the fluorescent powder instantaneously using a high temperature of jet plasma and vapor-depositing the same on a glass substrate.

8. The method as claimed in claim 7, wherein the vapor-depositing step makes use of a direct current arc plasma jet deposition device.

9. A method of fabricating a dielectric layer for a plasma display, comprising:

preparing glass powder;

mixing the glass powder with oxide powder;

melting the mixture of the glass powder and the oxide powder; and depositing the melted mixture of the glass powder and the oxide powder on a substrate.

10. The method as claimed in claim 9, wherein the mixing step includes mixing the glass powder with the oxide powder during a desired time and thereafter storing the mixture powder at a constant temperature within a dry oven.

11. The method as claimed in claim 9, wherein the mixture powder is deposited on a lower glass substrate of the plasma display device, thereby forming at least one of a dielectric thick film and a barrier rib.

12. A method of fabricating a fluorescent film for a plasma display device, comprising:

preparing fluorescent powder;

melting the fluorescent powder; and depositing the melted fluorescent powder on a substrate.

13. The method as claimed in claim 1, wherein the glass powder is non-crystallized.

14. The method as claimed in claim 6, wherein the glass powder is non-crystallized.

15. The method as claimed in claim 9, wherein the glass powder is non-crystallized.

16. The method as claimed in claim 12, wherein the glass powder is non-crystallized.

17. The method as claimed in claim 1, wherein the pressure vapor-depositing uses a directional pressurized stream of air with the mixture of the glass powder and the oxide powder dispersed within the air.

18. The method as claimed in claim 1, wherein the pressure vapor-depositing uses a directional pressurized stream of argon, and wherein the directional pressurized stream of argon is heated to about 6,000 to 10,000° C. and melts the mixture of glass powder and oxide powder, prior to the melted mixture being deposited at an approximate speed equal to the speed of sound.

19. The method as claimed in claim 6, wherein the pressure vapor-depositing uses a directional pressurized stream of air with the fluorescent powder dispersed within the air.

20. The method as claimed in claim 19, wherein the directional pressurized stream of air is heated to about 6,000 to 10,000° C. and melts the fluorescent powder, prior to the melted fluorescent powder being deposited.

21. The method as claimed in claim 9, wherein the depositing uses a directional pressurized stream of air to deposit the melted mixture of the glass powder and the oxide powder on a substrate.

22. The method as claimed in claim 21, wherein the pressurized stream of air is heated to about 6,000 to 10,000° C. and melts the mixture of the glass powder and the oxide powder upon the mixture's contact with the heated stream of air prior to the melted mixture's contact with the substrate.

23. The method as claimed in claim 12, wherein the depositing uses a directional pressurized stream of air to deposit the melted fluorescent powder on a substrate.

24. The method as claimed in claim 23, wherein the pressurized stream of air is heated to about 6,000 to 10,000° C. and melts the fluorescent powder upon contact prior to the melted fluorescent powder's contact with the substrate.

* * * * *